United States Patent
Mironov

(10) Patent No.: US 12,284,742 B2
(45) Date of Patent: **\*Apr. 22, 2025**

(54) INDUCTIVE HEATING DEVICE FOR HEATING AN AEROSOL-FORMING SUBSTRATE

(71) Applicant: PHILIP MORRIS PRODUCTS S.A., Neuchatel (CH)

(72) Inventor: Oleg Mironov, Neuchatel (CH)

(73) Assignee: PHILIP MORRIS PRODUCTS S.A., Neuchatel (CH)

( * ) Notice: Subject to any disclaimer, the term of this patent is extended or adjusted under 35 U.S.C. 154(b) by 892 days.

This patent is subject to a terminal disclaimer.

(21) Appl. No.: 16/686,340

(22) Filed: Nov. 18, 2019

(65) Prior Publication Data
US 2020/0077715 A1 Mar. 12, 2020

Related U.S. Application Data

(63) Continuation of application No. 15/121,548, filed as application No. PCT/EP2015/061200 on May 21, 2015, now Pat. No. 10,477,894.

(30) Foreign Application Priority Data

May 21, 2014 (EP) .................................... 14169191

(51) Int. Cl.
  *H05B 6/06* (2006.01)
  *A24F 40/20* (2020.01)
  (Continued)

(52) U.S. Cl.
  CPC .............. *H05B 6/06* (2013.01); *A24F 40/46* (2020.01); *A24F 40/465* (2020.01); *A24F 40/53* (2020.01);
  (Continued)

(58) Field of Classification Search
  None
  See application file for complete search history.

(56) References Cited

U.S. PATENT DOCUMENTS 4,016,530 A 4/1977 Goll
4,457,011 A 6/1984 Hoover
(Continued)

FOREIGN PATENT DOCUMENTS

CN 1126426 A 7/1996
CN 1549653 11/2004
(Continued)

OTHER PUBLICATIONS

Translation of GB-2163630-A (Year: 1986).*
(Continued)

*Primary Examiner* — Elizabeth M Kerr
(74) *Attorney, Agent, or Firm* — Oblon, McClelland, Maier & Neustadt, L.L.P.

(57) ABSTRACT

An inductive heating device (1) comprises
  a device housing (10)
  a DC power source (11),
  a power supply electronics (13) comprising a DC/AC inverter (132) including a Class-E power amplifier with a transistor switch (1320), a transistor switch driver circuit (1322), and an LC load network (1323) configured to operate at low ohmic load (1324), the LC load network (1323) comprising a shunt capacitor (C1) and a series connection of a capacitor (C2) and an inductor (L2), and
  a cavity (14) arranged in the device housing (10), the cavity (14) having an internal surface shaped to accommodate at least a portion of the aerosol-forming substrate (20), wherein the cavity (14) is arranged such that
  (Continued)

Figure 1:
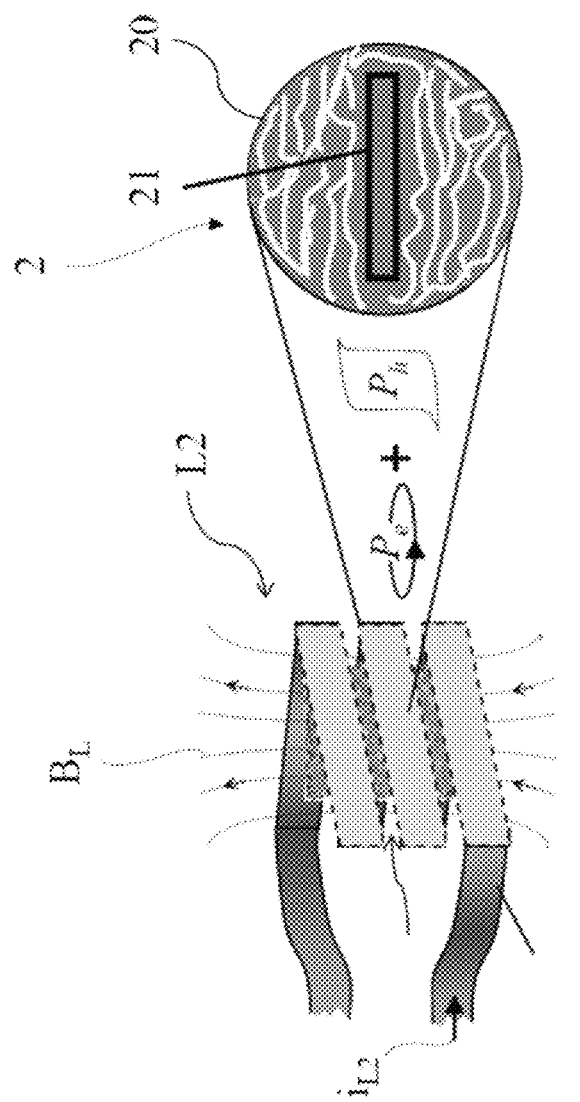

the inductor (L2) is inductively coupled to the susceptor (21) of the aerosol-forming substrate (20) during operation.

21 Claims, 5 Drawing Sheets

(51) Int. Cl.
*A24F 40/46* (2020.01)
*A24F 40/465* (2020.01)
*A24F 40/53* (2020.01)
*H05B 1/02* (2006.01)
*H05B 6/04* (2006.01)
*H05B 6/10* (2006.01)
*H05B 6/36* (2006.01)

(52) U.S. Cl.
CPC .......... *H05B 1/0244* (2013.01); *H05B 6/04* (2013.01); *H05B 6/105* (2013.01); *H05B 6/108* (2013.01); *H05B 6/36* (2013.01); *A24F 40/20* (2020.01); *H05B 2203/021* (2013.01); *H05B 2206/02* (2013.01); *H05B 2206/023* (2013.01)

(56) References Cited

U.S. PATENT DOCUMENTS

| | | | |
|---|---|---|---|
| 4,482,246 A | 11/1984 | Meyer et al. | |
| 4,607,323 A | 8/1986 | Sokal | |
| 5,573,613 A | 11/1996 | Lunden | |
| 5,613,505 A * | 3/1997 | Campbell | H05B 6/365 131/194 |
| 5,649,554 A | 7/1997 | Sprinkel et al. | |
| 5,729,511 A | 3/1998 | Schell | |
| 6,061,257 A | 5/2000 | Spampinato | |
| 6,254,940 B1 | 7/2001 | Pratsinis | |
| 6,320,169 B1 * | 11/2001 | Clothier | G06K 19/0723 340/572.1 |
| 6,566,636 B1 | 5/2003 | Bentley et al. | |
| 6,681,998 B2 | 1/2004 | Sharpe | |
| 6,934,645 B2 | 8/2005 | Kim | |
| 7,714,649 B1 | 5/2010 | Cripe | |
| 8,362,407 B2 | 1/2013 | Coffey et al. | |
| 8,521,442 B2 | 8/2013 | Wang | |
| 10,028,533 B2 | 7/2018 | Fursa | |
| 11,483,902 B2 * | 10/2022 | Zinovik | H05B 6/36 |
| 11,844,168 B2 * | 12/2023 | Zinovik | H05B 6/04 |
| 2002/0135419 A1 | 9/2002 | Groves | |
| 2004/0004071 A1 | 1/2004 | Ogasawara | |
| 2004/0149737 A1 | 8/2004 | Sharpe | |
| 2005/0270118 A1 | 12/2005 | Shannon | |
| 2006/0145761 A1 * | 7/2006 | Pribble | H03F 3/217 330/251 |
| 2006/0243277 A1 | 11/2006 | Denyer et al. | |
| 2007/0045288 A1 * | 3/2007 | Nelson | A61M 11/041 219/533 |
| 2007/0114945 A1 * | 5/2007 | Mattaboni | G01N 21/73 315/111.01 |
| 2009/0016085 A1 | 1/2009 | Rader | |
| 2011/0036346 A1 * | 2/2011 | Cohen | A24F 40/60 128/200.14 |
| 2012/0018425 A1 | 1/2012 | Lasko | |
| 2012/0048266 A1 | 3/2012 | Alelov | |
| 2012/0085745 A1 | 4/2012 | Brattoli | |
| 2012/0145703 A1 * | 6/2012 | Matsen | B29C 73/10 219/618 |
| 2012/0234315 A1 * | 9/2012 | Li | A61M 15/06 128/200.21 |
| 2013/0082047 A1 | 4/2013 | Matsen | |
| 2013/0277362 A1 | 10/2013 | Ribarich | |
| 2014/0020693 A1 | 1/2014 | Cochand | |
| 2014/0149737 A1 | 5/2014 | Kulkarni | |
| 2014/0345633 A1 | 11/2014 | Talon | |
| 2016/0120221 A1 | 5/2016 | Mironov | |
| 2017/0055587 A1 | 3/2017 | Zinovik | |
| 2017/0079330 A1 | 3/2017 | Mironov et al. | |
| 2017/0127722 A1 | 5/2017 | Davis | |
| 2017/0201217 A1 | 7/2017 | Waller | |
| 2019/0297949 A1 | 10/2019 | Mironov et al. | |

FOREIGN PATENT DOCUMENTS

| | | | |
|---|---|---|---|
| CN | 1910044 A | 2/2007 | |
| CN | 101135705 | 3/2008 | |
| CN | 101390659 | 3/2009 | |
| CN | 101862038 | 10/2010 | |
| CN | 102014677 A | 4/2011 | |
| CN | 103338665 | 10/2013 | |
| CN | 103689812 | 4/2014 | |
| CN | 103997921 | 8/2014 | |
| CN | 203762288 U * | 8/2014 | |
| DE | 695 21 856 T2 | 4/2002 | |
| EP | 0845220 | 9/2003 | |
| EP | 2444112 | 4/2012 | |
| GB | 2163630 A * | 2/1986 | ............. B29C 47/82 |
| JP | 8-511175 | 10/1996 | |
| JP | 3325028 | 9/2002 | |
| JP | 2003-323970 A | 11/2003 | |
| JP | 2013-508723 A | 3/2013 | |
| JP | 2015-507477 | 3/2015 | |
| KR | 10-2008-0095139 | 10/2008 | |
| KR | 10-2013-0130759 | 12/2013 | |
| RU | 012169 B1 | 8/2009 | |
| WO | WO 95/27411 | 10/1995 | |
| WO | WO 2006/048774 A1 | 5/2006 | |
| WO | WO 2011/049846 A2 | 4/2011 | |
| WO | WO 2011/050964 | 5/2011 | |
| WO | WO 2012/085203 | 6/2012 | |
| WO | WO 2013/060743 | 5/2013 | |
| WO | WO 2013/098398 | 7/2013 | |
| WO | WO 2015/177045 A1 | 11/2015 | |
| WO | WO 2015/177046 | 11/2015 | |

OTHER PUBLICATIONS

Sokal, Class-E RF Power Amplifiers, QEX, American Radio Relay League (ARRL), Jan./Feb. 2001, pp. 9-20. (Year: 2001).*
PCT Search Report and Written Opinion for PCT/EP2015/061201 dated Aug. 26, 2015 (9 pages).
PCT International Preliminary Report on Patentability for PCT/EP2015/061201 dated May 6, 2016 (5 pages).
Japanese Office Action issued Nov. 9, 2020 in Japanese Patent Application No. 2019-212190 (submitting English translation only), 5 pages.
Notice of Grounds for Rejection issued Mar. 16, 2020 in Japanese Patent Application No. 2018-231381 (with English language translation), 6 pages.
Extended European Search Report issued Sep. 11, 2020 in European Patent Application No. 20174413.3, 9 pages.
Indian Office Action issued Sep. 22, 2020 in Indian Patent Application No. 201617026867, 6 pages.
Nathan O. Sokal, "Class E—A New Class of High-Efficiency Tuned Single-Ended Switching Power Amplifiers," IEEE Journal of Solid-State Circuits, vol. SC-10, No. 3, XP000601709, Jun. 1975, pp. 168-176.
Combined Chinese Office Action and Search Report issued Aug. 12, 2021 in Patent Application No. 201910982720.5 (with English language translation), 29 pages.
Lungu et al., "Simulation and Design of a Class E Power Amplifier", presented on IEEE 2009 32nd International Spring Seminars on Electronics Technology, May 13-17, 2009, Brno, Czech Republic.
Grebennikov et al., Switchmode RF and Microwave Power Amplifiers, Second Edition, "Class-E with Shunt Capacitance", pp. 245-437, 2012.
High-Efficiency Radio-Frequency Power Amplifiers, doctoral thesis of G.D. Ewing, published Jun. 1965, 71 pages.

(56) References Cited

OTHER PUBLICATIONS

Shen Jinfei et al., "E-class Resonate High-Frequency DC/AC Converter", Power Electronics, vol. 36, No. 1, pp. 4-6. English translation included.
Communication Pursuant to Rule 114(2) EPC, Third Party Observations, for Application No. 15727324.4 dated Sep. 9, 2016 (8 pages).
Microchip Application Note AN850 (2002), 10 pages.
Texas Instruments Application Note AN298 (1982-2013), 12 pages.
Bundalo et al., "DaWei Induction Heating Machine", Electronic Letters, Jul. 7, 1988, vol. 24, No. 14.
Slade, Bill, "Notes on Designing Class-E RF Power Amplifiers", May 4, 2010.
Sokal, Nathan O. "Class-E RF Power Amplifiers", WA1HYC, Jan.-Feb. 2001.
PCT Search Report and Written Opinion for PCT/EP2015/061200 dated Aug. 25, 2015 (10 pages).
PCT International Preliminary Report on Patentability for PCT/EP2015/061200 dated May 6, 2016 (6 pages).
Russian Federation Office Action issued Feb. 8, 2022 in Russian Federation Patent Application No. 2018135084/03 (with English translation), 14 pages.
Indian Post Grant Opposition issued Mar. 18, 2023 in Indian Patent Application No. 201617026867, 165 pages.
Extended Search Report dated Nov. 13, 2023, issued in corresponding European patent application No. 23176783.1.
Notice of Opposition dated Jul. 14, 2023, issued in corresponding Indian patent application No. 201617026867 (23 pages).

* cited by examiner

INDUCTIVE HEATING DEVICE FOR HEATING AN AEROSOL-FORMING SUBSTRATE

This application is a continuation application of U.S. application Ser. No. 15/121,548 filed Aug. 25, 2016 and which is a U.S. National Stage Application of International Application No. PCT/EP2015/061200, filed May 21, 2015, which was published in English on Nov. 26, 2015, as International Patent Publication WO 2015/177255 A1. International Application No. PCT/EP2015/061200 claims priority to European Application Nos. 14169191.5 filed May 21, 2014. A certified copy of European Application No. 14169191.5 filed May 21, 2014, was provided in, and is available in, U.S. patent application Ser. No. 15/121,548, for which certified copy is available in PAIR.

The present invention relates to an inductive heating device for heating an aerosol-forming substrate, and more particularly relates to an inductive heating device for heating an aerosol-forming substrate of a smoking article.

Previously known more conventional smoking articles, for example cigarettes, deliver flavor and aroma to the user as a result of a combustion process. A mass of combustible material, primarily tobacco, is combusted and an adjacent portion of material is pyrolized as the result of applied heat drawn therethrough, with typical combustion temperatures being in excess of 800° C. during puffing. During this heating, inefficient oxidation of the combustible material takes place and yields various distillation and pyrolysis products. As these products are drawn through the body of the smoking article towards the mouth of the user, they cool and condense to form an aerosol or vapor which gives the consumer the flavor and aroma associated with smoking.

A prior alternative to the more conventional smoking articles include those in which the combustible material itself does not directly provide the flavorants to the aerosol inhaled by the smoker. In these smoking articles, a combustible heating element, typically carbonaceous in nature, is combusted to heat air as it is drawn over the heating element and through a zone which contains heat-activated elements that release the flavored aerosol.

Yet another alternative to the more conventional smoking articles comprises an aerosol-forming tobacco-laden solid substrate comprising a magnetically permeable and electrically conductive susceptor which is arranged in thermal proximity to the aerosol-forming tobacco-laden substrate. The susceptor of the tobacco-laden substrate is exposed to an alternating magnetic field generated by an induction source, so that an alternating magnetic field is induced in the susceptor.

This induced alternating magnetic field generates heat in the susceptor, and at least some of this heat generated in the susceptor is transferred from the susceptor to the aerosol-forming substrate arranged in thermal proximity to the susceptor to produce the aerosol and evolve the desired flavor.

There is a need for an induction heating device for aerosol-forming substrates including a susceptor, more particularly for solid aerosol-forming substrates including a susceptor, for example solid aerosol-forming substrates of a smoking article. The induction heating device shall be capable of operating without the need to be connected to an external power supply. In addition, the device shall be small in overall size and easy to use, so that it is attractive to users. The device shall allow for rapid generation of the required heat in the susceptor, which can then be transferred to the aerosol-forming substrate in order to produce the aerosol to allow a user to draw the aerosol on demand.

In accordance with one aspect of the invention an inductive heating device for heating an aerosol-forming substrate comprising a susceptor is suggested, in particular for heating a solid aerosol-forming substrate of a smoking article. The inductive heating device according to the invention comprises:
  a device housing
  a DC power source having a DC supply voltage
  a power supply electronics configured to operate at high frequency, the power supply electronics comprising a DC/AC inverter connected to the DC power source, the DC/AC inverter including a Class-E power amplifier including a transistor switch and an LC load network configured to operate at low ohmic load, wherein the LC load network comprises a shunt capacitor and a series connection of a capacitor and an inductor having an ohmic resistance, and
  a cavity arranged in the device housing, the cavity having an internal surface shaped to accommodate at least a portion of the aerosol-forming substrate, the cavity being arranged such that upon accommodation of the portion of the aerosol-forming substrate in the cavity the inductor of the LC load network is inductively coupled to the susceptor of the aerosol-forming substrate during operation.

The aerosol-forming substrate is preferably a substrate capable of releasing volatile compounds that can form an aerosol. The volatile compounds are released by heating the aerosol-forming substrate. The aerosol-forming substrate may be solid or liquid or comprise both solid and liquid components. In a preferred embodiment, the aerosol-forming substrate is solid.

The aerosol-forming substrate may comprise nicotine. The nicotine containing aerosol-forming substrate may be a nicotine salt matrix. The aerosol-forming substrate may comprise plant-based material. The aerosol-forming substrate may comprise tobacco, and preferably the tobacco containing material contains volatile tobacco flavor compounds, which are released from the aerosol-forming substrate upon heating.

The aerosol-forming substrate may comprise homogenized tobacco material. Homogenized tobacco material may be formed by agglomerating particulate tobacco. Where present, the homogenized tobacco material may have an aerosol-former content of equal to or greater than 5% on a dry weight basis, and preferably between greater than 5% and 30% by weight on a dry weight basis.

The aerosol-forming substrate may alternatively comprise a non-tobacco-containing material. The aerosol-forming substrate may comprise homogenized plant-based material.

The aerosol-forming substrate may comprise at least one aerosol-former. The aerosol-former may be any suitable known compound or mixture of compounds that, in use, facilitates formation of a dense and stable aerosol and that is substantially resistant to thermal degradation at the operating temperature of the aerosol-generating device. Suitable aerosol-formers are well known in the art and include, but are not limited to: polyhydric alcohols, such as triethylene glycol, 1,3-butanediol and glycerine; esters of polyhydric alcohols, such as glycerol mono-, di- or triacetate; and aliphatic esters of mono-, di- or polycarboxylic acids, such as dimethyl dodecanedioate and dimethyl tetradecanedioate. Particularly preferred aerosol formers are polyhydric alcohols or mixtures thereof, such as triethylene glycol, 1,3-butanediol and, most preferred, glycerine. The aerosol-forming substrate may comprise other additives and ingredients, such as flavorants. The aerosol-forming substrate preferably comprises nicotine and at least one aerosol-former. In a particularly preferred embodiment, the aerosol-former is glycerine.

The DC power source generally may comprise any suitable DC power source including in particular a power supply unit to be connected to the mains, one or more single-use batteries, rechargeable batteries, or any other suitable DC power source capable of providing the required DC supply voltage and the required DC supply amperage. In one embodiment, the DC supply voltage of the DC power source is in the range of about 2.5 Volts to about 4.5 Volts and the DC supply amperage is in the range of about 2.5 to about 5 Amperes (corresponding to a DC supply power in the range of about 6.25 Watts and about 22.5 Watts). Preferably, the DC power source comprises rechargeable batteries. Such batteries are generally available and have an acceptable overall volume of between approximately 1.2-3.5 cubic centimeters. Such batteries may have a substantially cylindrical or rectangular solid shape. Also, the DC power source may include a DC feed choke.

As a general rule, whenever the term "about" is used in connection with a particular value throughout this application this is to be understood such that the value following the term "about" does not have to be exactly the particular value due to technical considerations. However, the term "about" used in connection with a particular value is always to be understood to include and also to explicitly disclose the particular value following the term "about".

The power supply electronics is configured to operate at high frequency. For the purpose of this application, the term "high frequency" is to be understood to denote a frequency ranging from about 1 Megahertz (MHz) to about 30 Megahertz (MHz) (including the range of 1 MHz to 30 MHz), in particular from about 1 Megahertz (MHz) to about 10 MHz (including the range of 1 MHz to 10 MHz), and even more particularly from about 5 Megahertz (MHz) to about 7 Megahertz (MHz) (including the range of 5 MHz to 7 MHz).

The power supply electronics comprises a DC/AC inverter connected to the DC power source. The DC/AC inverter includes a Class-E power amplifier including a transistor switch, a transistor switch driver circuit, and an LC load network. Class-E power amplifiers are generally known and are described in detail, for example, in the article "Class-E RF Power Amplifiers", Nathan O. Sokal, published in the bimonthly magazine QEX, edition January/February 2001, pages 9-20, of the American Radio Relay League (ARRL), Newington, CT, U.S.A. Class-E power amplifiers are advantageous as regards operation at high frequencies while at the same time having a simple circuit structure comprising a minimum number of components (e.g. only one transistor switch needed, which is advantageous over Class-D power amplifiers which comprise two transistor switches that must be controlled at high frequency in a manner so as to make sure that one of the two transistors has been switched off at the time the other of the two transistors is switched on). In addition, Class-E power amplifiers are known for minimum power dissipation in the switching transistor during the switching transitions. Preferably, the Class-E power amplifier is a single-ended first order Class-E power amplifier having a single transistor switch only.

The transistor switch of the Class-E power amplifier can be any type of transistor and may be embodied as a bipolar-junction transistor (BJT). More preferably, however, the transistor switch is embodied as a field effect transistor (FET) such as a metal-oxide-semiconductor field effect transistor (MOSFET) or a metal-semiconductor field effect transistor (MOSFET).

The LC load network of the Class-E power amplifier of the induction heating device according to the invention is configured to operate at low ohmic load. The term "low ohmic load" is to be understood to denote an ohmic load smaller than about 2 Ohms. The LC load network comprises a shunt capacitor, and a series connection of a capacitor and an inductor having an ohmic resistance. This ohmic resistance of the inductor is typically a few tenths of an Ohm. In operation, the ohmic resistance of the susceptor adds to the ohmic resistance of the inductor and should be higher than the ohmic resistance of the inductor, since the supplied electrical power should be converted to heat in the susceptor to an as high extent as possible in order to increase efficiency of the power amplifier and to allow transfer of as much heat as possible from the susceptor to the rest of the aerosol-forming substrate to effectively produce the aerosol.

A susceptor is a conductor which is capable of being inductively heated. "Thermal proximity" means that the susceptor is positioned relative to the rest of the aerosol-forming substrate such that an adequate amount of heat is transferred from the susceptor to the rest of the aerosol-forming substrate to produce the aerosol.

Since the susceptor is not only magnetically permeable but also electrically conductive (it is a conductor, see above), a current known as eddy current is produced in the susceptor and flows in the susceptor according to Ohm's law. The susceptor should have low electrical resistivity p to increase Joule heat dissipation. In addition, the frequency of the alternating eddy current must be considered because of the skin effect (more than 98% of the electrical current flow within a layer four times the skin depth δ from the outer surface of the conductor). Taking this into account the ohmic resistance $R_S$ of the susceptor is calculated from the equation $$R_S = \sqrt{2\pi f \mu_0 \mu_r}$$

wherein f denotes the frequency of the alternating eddy current $\mu_0$ denotes the magnetic permeability of free space $\mu_r$ denotes the relative magnetic permeability of the material of the susceptor, and ρ denotes the electrical resistivity of the material of the susceptor.

The power loss $P_e$ generated by the eddy current is calculated by the formula $$P_e = I^2 \cdot R_S$$

wherein

I denotes the amperage (rms) of the eddy current, and $R_S$ denotes the electrical resistance of the susceptor (see above)

From this equation for $P_e$ and from the calculation of $R_S$ it can be seen that for a material having a known relative magnetic permeability $P_r$ and a given electrical resistivity p it is evident that the power loss $P_e$ generated by the eddy current (through conversion to heat) increases with increasing frequency and increasing amperage (rms). On the other hand, the frequency of the alternating eddy current (and correspondingly of the alternating magnetic field inducing the eddy current in the susceptor) cannot be arbitrarily increased, since the skin depth δ decreases as the frequency of the eddy current (or of the alternating magnetic field inducing the eddy current in the susceptor) increases, so that above a certain cut-off frequency no eddy currents can be generated in the susceptor anymore since the skin depth is too small to allow eddy currents to be generated. Increasing the amperage (rms) requires an alternating magnetic field having a high magnetic flux density and thus requires voluminous induction sources (inductors).

In addition, heat is produced in the susceptor through the heating mechanism associated with hysteresis. The power loss generated by hysteresis is calculated from the equation $$P_H = V \cdot W_H \cdot f$$

wherein

V denotes the volume of the susceptor $W_H$ denotes the work required to magnetize the susceptor along a closed hysteresis loop in the B—H diagram, and f denotes the frequency of the alternating magnetic field.

The work $W_H$ required to magnetize the susceptor along a closed hysteresis loop can also be expressed as $$W_H = \oint H \cdot dB$$

The maximum possible amount of $W_H$ depends on material properties of the susceptor (saturation remanence $B_R$, coercivity $H_C$), and the actual amount of $W_H$ depends on the actual magnetization B—H loop induced in the susceptor by the alternating magnetic field, and this actual magnetization B—H loop depends on the magnitude of the magnetic excitation.

There is a third mechanism generating heat (power loss) in the susceptor. This heat generation is caused by dynamic losses of the magnetic domains in the magnetically permeable susceptor material when the susceptor is subjected to an alternating external magnetic field, and these dynamic losses also generally increase as the frequency of the alternating magnetic field increases.

To be able to generate the heat in the susceptor in accordance with the afore-described mechanisms (mainly through eddy current losses and hysteresis losses), a cavity is arranged in the device housing. The cavity has an internal surface shaped to accommodate at least a portion of the aerosol-forming substrate. The cavity is arranged such that upon accommodation of the portion of the aerosol-forming substrate in the cavity the inductor of the LC load network is inductively coupled to the susceptor of the aerosol-forming substrate during operation. This means, that the inductor of the LC load network of the Class-E power amplifier is used to heat the susceptor through magnetic induction. This eliminates the need for additional components such as matching networks for matching the output impedance of the Class-E power amplifier to the load, thus allowing to further minimize the size of the power supply electronics.

Overall, the inductive heating device according to the invention provides for a small and easy to handle, efficient, clean and robust heating device due to the contactless heating of the substrate. For susceptors forming low ohmic loads as specified above while having a resistance significantly higher than the ohmic resistance of the inductor of the LC load network, it is thus possible to reach temperatures of the susceptor in the range of 350-400 degrees Celsius in five seconds only or in a time interval which is even less than five seconds, while at the same time the temperature of the inductor is low (due to a vast majority of the power being converted to heat in the susceptor).

As mentioned already, in accordance with one aspect of the inductive heating device according to the invention the device is configured for heating an aerosol-forming substrate of a smoking article. This includes in particular, that power is provided to the susceptor within the aerosol-forming substrate such that the aerosol forming substrate is heated to an average temperature of between 200-240 degrees Celsius. Even more preferably, the device is configured for heating a tobacco-laden solid aerosol-forming substrate of a smoking article.

In accordance with a further aspect of the inductive heating device according to the invention, the total volume of the power supply electronics is equal to or smaller than 2 cm³. This allows for an arrangement of the batteries, the power supply electronics and the cavity in a device housing having an overall small size which is convenient and easy to handle.

According to a further aspect of the inductive heating device according to the invention, the inductor of the LC load network comprises a helically wound cylindrical inductor coil having an oblong shape and defining an inner volume in the range of about 0.15 cm³ and about 1.10 cm³. For example, the inner diameter of the helically wound cylindrical inductor coil may be between about 5 mm and about 10 mm, and may preferably be about 7 mm, and the length of the helically wound cylindrical inductor coil may be between about 8 mm and about 14 mm. The diameter or the thickness of the coil wire may be between about 0.5 mm and about 1 mm, depending on whether a coil wire with a circular cross-section or a coil wire with a flat rectangular cross-section is used. The helically wound inductor coil is positioned on or adjacent the internal surface of the cavity. A helically wound cylindrical inductor coil positioned on or adjacent the internal surface of the cavity allows to further minimize the size of the device.

According to yet another aspect of the inductive heating device according to the invention, the device housing has a substantially cylindrical shape with the cavity being arranged at the proximal end of the device housing and with the DC power source being arranged at the distal end of the device housing. The power supply electronics is arranged between the DC power source and the cavity. This allows for a space-saving and aesthetically pleasing arrangement of all components of the inductive heating device in a small and easy to handle device housing.

As already mentioned above, in accordance with another aspect of the inductive heating device according to the invention, the DC power source comprises a rechargeable DC battery. This allows for recharging the batteries, preferably through a connection to the mains via a charging device comprising an AC/DC converter.

In accordance with yet another aspect of the inductive heating device according to the invention, the power supply electronics further comprises a microcontroller which is programmed to interrupt generation of AC power by the DC/AC inverter as the temperature of the susceptor of the aerosol-forming substrate has exceeded a Curie temperature of the susceptor during operation, and which is programmed to resume generation of AC power as the temperature of the susceptor has cooled down below this Curie temperature again. This feature can be used for controlling the temperature of the susceptor with the aid of the microcontroller.

In case the susceptor is made from one single material, the Curie temperature should correspond to a maximum temperature the susceptor should have (that is to say the Curie temperature is identical with the maximum temperature to which the susceptor should be heated or deviates from this maximum temperature by about 1-3%. As the temperature of the susceptor exceeds the Curie temperature of this single material, the ferromagnetic properties of the susceptor are no longer present and the susceptor is paramagnetic only.

In case the susceptor is made from more than one material, the materials of the susceptor can be optimized with respect to further aspects. For example, the materials can be selected such that a first material of the susceptor may have a Curie temperature which is above the maximum temperature to which the susceptor should be heated. This first material of the susceptor may then be optimized, for example, with respect to maximum heat generation and transfer to the rest of the aerosol-forming substrate to provide for an efficient heating of the susceptor on one hand, however, the susceptor then additionally may comprise a second material having a Curie temperature which corresponds to the maximum temperature to which the susceptor should be heated, and once the susceptor reaches this Curie temperature the magnetic properties of the susceptor as a whole change. This change can be detected and communicated to the microcontroller which then interrupts the generation of AC power until the temperature has cooled down below this Curie temperature again, whereupon AC power generation can be resumed.

In accordance with another aspect of the inductive heating device according to the invention the class E power amplifier has an output impedance, and the power supply electronics further comprises a matching network for matching the output impedance of the class E power amplifier to the low ohmic load. This measure may be helpful to further increase power losses in the low ohmic load leading to an increased generation of heat in the low ohmic load. For example, the matching network may include a small matching transformer.

Another aspect of the invention relates to an inductive heating system comprising an inductive heating device according to anyone of the embodiments described above and an aerosol-forming substrate comprising a susceptor. At least a portion of the aerosol-forming substrate is accommodated in the cavity of the inductive heating device such that the inductor of the LC load network of the DC/AC inverter of the inductive heating device is inductively coupled to the susceptor of the aerosol-forming substrate during operation.

According to one aspect of the inductive heating system according to the invention the aerosol-forming substrate may be an aerosol-forming substrate of a smoking article. In particular, the aerosol-forming substrate may be a tobacco-laden solid aerosol-forming substrate which may be used in smoking articles (such as, for example, cigarettes).

Yet a further aspect of the invention relates to a kit comprising an inductive heating device in accordance with any of the afore-described embodiments and an aerosol-forming substrate comprising a susceptor. The inductive heating device and the aerosol-forming substrate are configured such that in operation at least a portion of the aerosol-forming substrate is accommodated in the cavity of the inductive heating device such that the inductor of the LC load network of the DC/AC inverter of the inductive heating device is inductively coupled to the susceptor of the aerosol-forming substrate. While generally, the aerosol-forming substrate and the inductive heating device can be provided separately, they can also be provided in the form of a kit of parts. Or, alternatively a starter kit may comprise the inductive heating device and a plurality of aerosol-forming substrates while in addition only aerosol-forming substrates are provided, so that once the consumer has obtained an inductive heating device in the starter kit and has consumed the aerosol-forming substrates contained in the starter kit, the consumer is only in need of additional aerosol-forming substrates. Again, in accordance with one aspect of the kit according to the invention, the aerosol-forming substrate may be an aerosol-forming substrate of a smoking article, and in particular the aerosol-forming substrate of the smoking article may be a tobacco-laden solid aerosol-forming substrate.

Still a further aspect of the invention relates to a method of operating an inductive heating system. The method comprises the steps of:

providing a DC power source having a DC supply voltage, providing a power supply electronics configured to operate at high frequency, the power supply electronics comprising a DC/AC inverter connected to the DC power source, the DC/AC inverter including a Class-E power amplifier including a transistor switch, a transistor switch driver circuit, and an LC load network configured to operate at low ohmic load, wherein the LC load network comprises a shunt capacitor and a series connection of a capacitor and an inductor having an ohmic resistance, providing a cavity capable of accommodating at least a portion of an aerosol-forming substrate, the cavity being arranged such that upon accommodation of the portion of the aerosol-forming substrate in the cavity the inductor of the LC load network is inductively coupled to the susceptor of the aerosol-forming substrate, and providing an aerosol-forming substrate comprising a susceptor and inserting at least a portion of the aerosol-forming substrate into the cavity such that the inductor of the LC load network is inductively coupled to the susceptor of the aerosol-forming substrate.

According to one aspect of the method according to the invention, the DC power source is a rechargeable battery and the method further comprises the step of charging the rechargeable battery prior to inserting the portion of the aerosol-forming substrate into the cavity. This aspect is particularly advantageous since in case rechargeable batteries are used, the device can be used (after charging of the batteries) without a connection to the mains or to another external power source being necessary. Once the battery charge is at low level, the rechargeable battery can be easily recharged again, so that it is not necessary to carry any single-use replacement batteries along. If the battery charge is low, the rechargeable battery can be simply recharged and the device is ready for use again. In addition, rechargeable batteries are friendly to the environment since there are no single-use batteries that must be properly disposed of.

Figure 2:
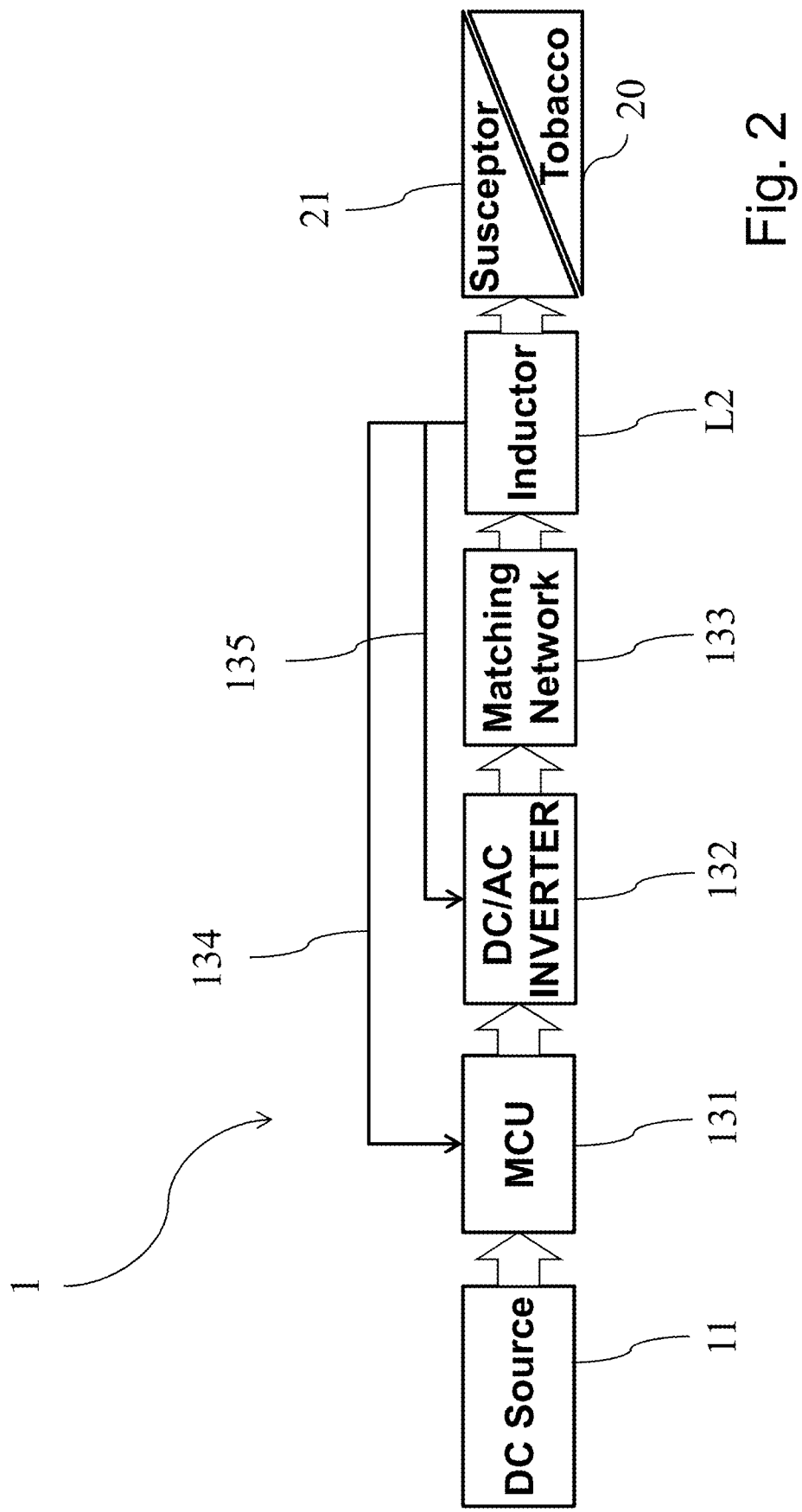
Figure 3:
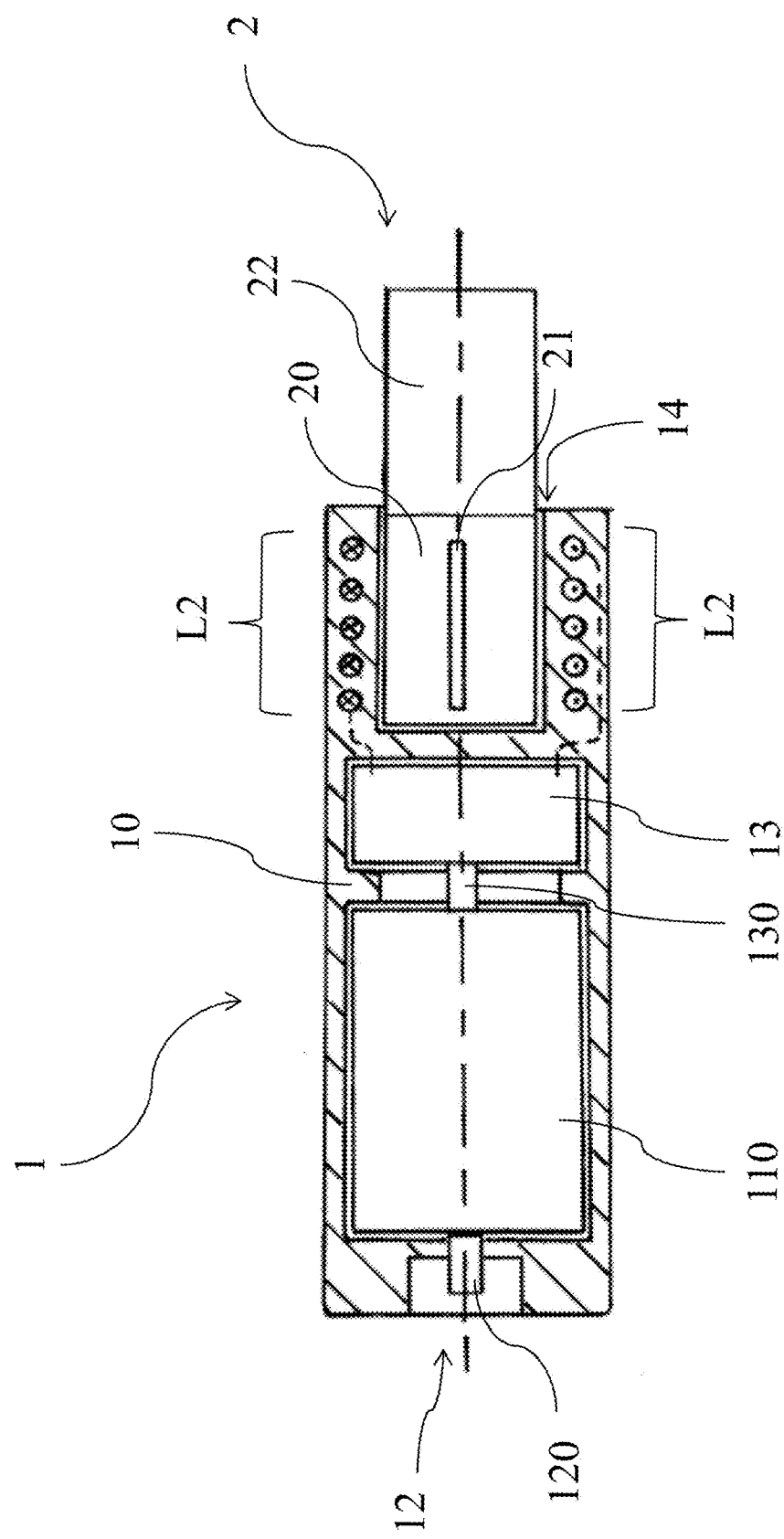
Figure 4:
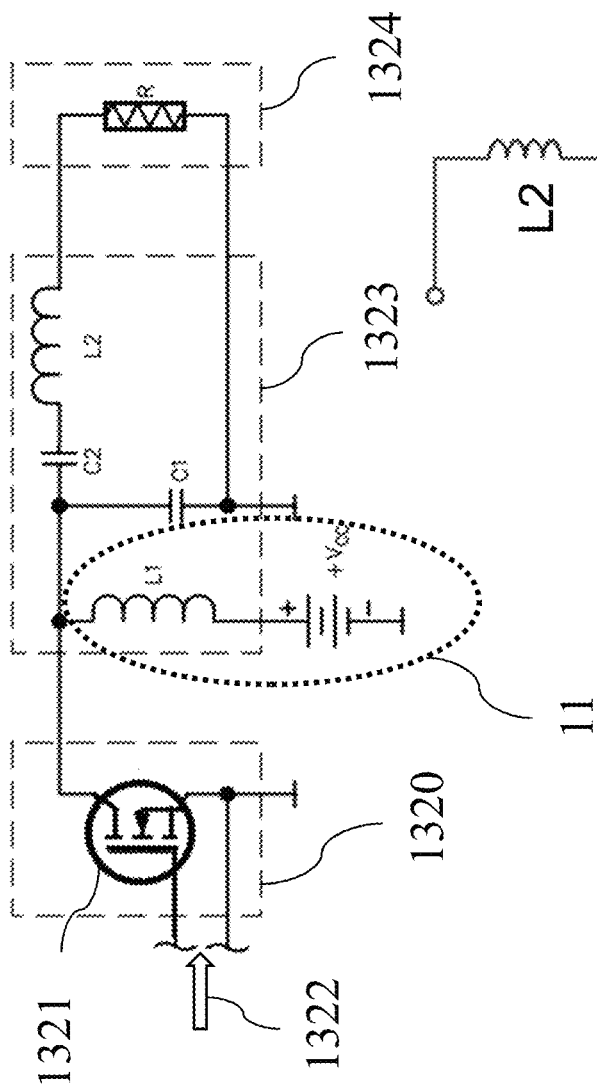
Figure 6:
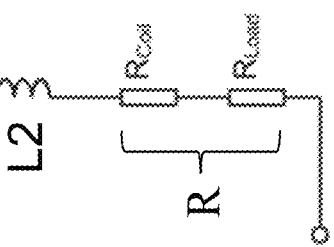
Figure 5:
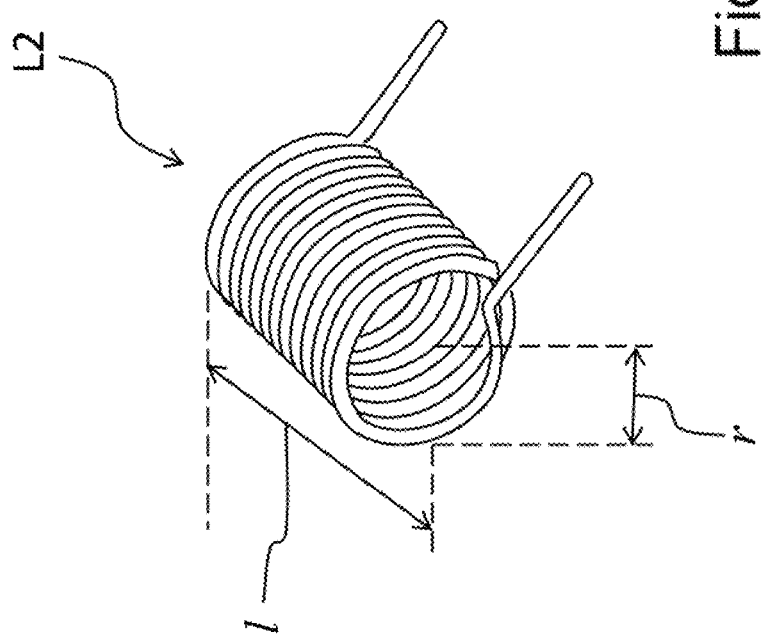

Further advantageous aspects of the invention will become apparent from the following description of embodiments with the aid of the drawings in which:

FIG. 1 shows the general heating principle underlying the invention,

FIG. 2 shows a block diagram of an embodiment of the inductive heating device and system according to the invention, FIG. 3 shows an embodiment of the inductive heating device with the essential components arranged in a device housing, FIG. 4 shows an embodiment of essential components of the power electronics of the inductive heating device according to the invention (without matching network), FIG. 5 shows an embodiment of the inductor of the LC load network in form of a helically wound cylindrical inductor coil having an oblong shape, FIG. 6 shows a detail of the LC load network including the inductivity and ohmic resistance of the coil, and in addition shows the ohmic resistance of the load.

In FIG. 1 the general heating principle underlying the instant invention is schematically illustrated. Schematically shown in FIG. 1 are a helically wound cylindrical inductor coil L2 having an oblong shape and defining an inner volume in which there is arranged a portion or all of an aerosol-forming substrate 20 of a smoking article 2, the aerosol-forming substrate comprising a susceptor 21. The smoking article 2 comprising the aerosol-forming substrate 20 with the susceptor 21 is schematically represented in the enlarged cross-sectional detail shown separately on the right hand side of FIG. 1. As mentioned already, the aerosol-forming substrate 20 of the smoking article 2 may be a tobacco-laden solid substrate, however, without being limited thereto.

In addition, in FIG. 1 the magnetic field within the inner volume of the inductor coil L2 is indicated schematically by a number of magnetic field lines $B_L$ at one specific moment in time, since the magnetic field generated by the alternating current $i_{L2}$ flowing through the inductor coil L2 is an alternating magnetic field changing its polarity at the frequency of the alternating current $i_{L2}$ which may be in the range of about 1 MHz to about 30 MHz (including the range of 1 MHz to 30 MHz), and may in particular be in the range of about 1 MHz to about 10 MHz (including the range of 1 MHz to 10 MHz, and may especially be smaller than 10 MHz), and very particularly the frequency may be in the range of about 5 MHz to about 7 MHz (including the range of 5 MHz to 7 MHz, and may for example be 5 MHz). The two main mechanisms responsible for generating heat in the susceptor 21, the power losses $P_e$ caused by eddy currents (closed circle representing the eddy currents) and the power losses $P_h$ caused by hysteresis (closed hysteresis curve representing the hysteresis), are also schematically indicated in FIG. 1. With respect to these mechanisms it is referred to the more detailed discussion of these mechanisms above.

FIG. 3 shows an embodiment of an inductive heating device 1 according to the invention. The inductive heating device 1 comprises a device housing 10 which can be made of plastic and a DC power source 11 (see FIG. 2) comprising a rechargeable battery 110. Inductive heating device 1 further comprises a docking port 12 comprising a pin 120 for docking the inductive heating device to a charging station or charging device for recharging the rechargeable battery 110. Still further, inductive heating device 1 comprises a power supply electronics 13 which is configured to operate at the desired frequency, for example at a frequency of 5 MHz as mentioned above. Power supply electronics 13 is electrically connected to the rechargeable battery 110 through a suitable electrical connection 130. And while the power supply electronics 13 comprises additional components which cannot be seen in FIG. 3, it comprises in particular an LC load network (see FIG. 4) which in turn comprises an inductor L2, this being indicated by the dashed lines in FIG. 3. Inductor L2 is embedded in the device housing 10 at the proximal end of device housing 10 to surround a cavity 14 which is also arranged at the proximal end of the device housing 10. Inductor L2 may comprise a helically wound cylindrical inductor coil having an oblong shape, as shown in FIG. 5. The helically wound cylindrical inductor coil L2 may have a radius r in the range of about 5 mm to about 10 mm, and in particular the radius r may be about 7 mm. The length l of the helically wound cylindrical inductor coil may be in the range of about 8 mm to about 14 mm. The inner volume accordingly, may be in the range of about 0.15 cm³ to about 1.10 cm³.

Returning to FIG. 3, the tobacco-laden solid aerosol-forming substrate 20 comprising susceptor 21 is accommodated in cavity 14 at the proximal end of the device housing 10 such that during operation the inductor L2 (the helically wound cylindrical inductor coil) is inductively coupled to susceptor 21 of the tobacco-laden solid aerosol-forming substrate 20 of smoking article 2. A filter portion 22 of the smoking article 2 may be arranged outside the cavity 14 of the inductive heating device 1 so that during operation the consumer may draw the aerosol through the filter portion 22. Once the smoking article is removed from the cavity 14, the cavity 14 can be easily cleaned since except for the open distal end through which the aerosol-forming substrate 20 of the smoking article 2 is to be inserted the cavity is fully closed and surrounded by those inner walls of the plastic device housing 10 defining the cavity 14.

FIG. 2 shows a block diagram of an embodiment of the inductive heating device 1 according to the invention, however, with some optional aspects or components as will be discussed below. Inductive heating device 1 together with the aerosol-forming substrate 20 including the susceptor 21 forms an embodiment of the inductive heating system according to the invention. The block diagram shown in FIG. 2 is an illustration taking the manner of operation into account. As can be seen, the inductive heating device 1 comprises a DC power source 11 (in FIG. 3 comprising the rechargeable battery 110), a microprocessor control unit 131, a DC/AC inverter 132, a matching network 133 for adaptation to the load, and the inductor L2. Microprocessor controller unit 131, DC/AC inverter 132 and matching network 133 as well as inductor L2 are all part of the power supply electronics 13 (see FIG. 1). Two feed-back channels 134 and 135 are provided for providing feed-back signals indicating the voltage and current through inductor L2 allowing to control the further supply of power. For example, in case the temperature of the susceptor exceeds a desired temperature, a corresponding signal may be generated interrupting the further supply of power until the temperature of the susceptor is again below the desired temperature whereupon further supply of power may be resumed. Correspondingly, it is possible to control the frequency of the switching voltage for optimal transfer of power to the susceptor. A matching network 133 may be provided for optimum adaptation to the load but is not mandatory and is not contained in the embodiment described in more detail in the following.

FIG. 4 shows some essential components of the power supply electronics 13, more particularly of the DC/AC inverter 132. As can be seen from FIG. 4, the DC/AC inverter includes a Class-E power amplifier including a transistor switch 1320 comprising a Field Effect Transistor (FET) 1321, for example a Metal-Oxide-Semiconductor Field Effect Transistor (MOSFET), a transistor switch supply circuit indicated by the arrow 1322 for supplying the switching signal (gate-source voltage) to the FET 1321, and an LC load network 1323 comprising a shunt capacitor C1 and a series connection of a capacitor C2 and inductor L2. In addition, the DC power source 11 including a choke L1 is shown for supplying a DC supply voltage $+V_{CC}$. Also shown in FIG. 4 is the ohmic resistance R representing the total ohmic load 1324, which is the sum of the ohmic resistance $R_{Coil}$ of the inductor L2 and the ohmic resistance $R_{Load}$ of the susceptor 21, as this is shown in FIG. 6.

It is evident, that due to the very low number of components the volume of the power supply electronics 13 can be kept extremely small. For example, the volume of the power supply electronics may be equal or smaller than 2 cm³. This extremely small volume of the power supply electronics is possible due to the inductor L2 of the LC load network 1323 being directly used as the inductor for the inductive coupling to the susceptor 21 of aerosol-forming substrate 20, and this small volume allows to keep the overall dimensions of the entire inductive heating device 1 small. In case a separate inductor other than the inductor L2 is used for the inductive coupling to the susceptor 21, this would automatically increase the volume of the power supply electronics, this volume being also increased if a matching network 133 is included in the power supply electronics.

While the general operating principle of the Class-E power amplifier is known and described in detail in the already mentioned article "Class-E RF Power Amplifiers", Nathan O. Sokal, published in the bimonthly magazine QEX, edition January/February 2001, pages 9-20, of the American Radio Relay League (ARRL), Newington, CT, U.S.A., some general principles will be explained in the following.

Let us assume that the transistor switch supply circuit 1322 supplies a switching voltage (gate-source voltage of the FET) having a rectangular profile to FET 1321. As long as FET 1321 is conducting ("on"-state), it does essentially constitute a short circuit (low resistance) and the entire current flows through choke L1 and FET 1321. As FET 1321 is non-conducting ("off"-state), the entire current flows into the LC load network since FET 1321 essentially represents an open circuit (high resistance). Switching the transistor between these two states inverts the supplied DC voltage and DC current into an AC voltage and AC current.

For efficiently heating the susceptor 21, an as large as possible amount of the supplied DC power is to be transferred in the form of AC power to inductor L2 (helically wound cylindrical inductor coil) and subsequently to the susceptor 21 of aerosol-forming substrate 20 which is inductively coupled to inductor 2. The power dissipated in the susceptor 21 (eddy current losses, hysteresis losses) generates heat in the susceptor 21, as described further above. Or to say it in other words, power dissipation in FET 1321 must be minimized while maximizing power dissipation in susceptor 21.

The power dissipation in FET 1321 during one period of the AC voltage/current is the product of the transistor voltage and current at each point in time during that period of the alternating voltage/current, integrated over that period, and averaged over that period. Since the FET 1321 must sustain high voltage during a part of that period and conduct high current during a part of that period, it must be avoided that high voltage and high current exist at the same time, since this would lead to substantial power dissipation in FET 1321. In the "on-" state of FET 1321, the transistor voltage is nearly zero when high current is flowing through the FET 1321. In the "off-" state of FET 1321, the transistor voltage is high but the current through FET 1321 is nearly zero.

The switching transitions unavoidably also extend over some fractions of the period. Nevertheless, a high voltage-current product representing a high power loss in FET 1321 can be avoided by the following additional measures. Firstly, the rise of the transistor voltage is delayed until after the current through the transistor has reduced to zero. Secondly, the transistor voltage returns to zero before the current through the transistor begins to rise. This is achieved by load network 1323 comprising shunt capacitor C1 and the series connection of capacitor C2 and inductor L2, this load network being the network between FET 1321 and the load 1324. Thirdly, the transistor voltage at turn-on time is practically zero (for a bipolar-junction transistor "BJT" it is the saturation offset voltage $V_o$). The turning-on transistor does not discharge the charged shunt capacitor C1, thus avoiding dissipating the shunt capacitor's stored energy. Fourthly, the slope of the transistor voltage is zero at turn-on time. Then, the current injected into the turning-on transistor by the load network rises smoothly from zero at a controlled moderate rate resulting in low power dissipation while the transistor conductance is building up from zero during the turn-on transition. As a result, the transistor voltage and current are never high simultaneously. The voltage and current switching transitions are time-displaced from each other.

For dimensioning the various components of the DC/AC inverter 132 shown in FIG. 4, the following equations have to be considered, which are generally known and have been described in detail in the afore-mentioned article "Class-E RF Power Amplifiers", Nathan O. Sokal, published in the bimonthly magazine QEX, edition January/February 2001, pages 9-20, of the American Radio Relay League (ARRL), Newington, CT, U.S.A.

Let $Q_L$ (quality factor of the LC load circuit) be a value which is in any event greater than 1.7879 but which is a value that can be chosen by the designer (see the afore-mentioned article) let further P be the output power delivered to the resistance R, and let f be the frequency, then the various components are numerically calculated from the following equations ($V_o$ being zero for FETs, and being the saturation offset voltage for BJTs, see above):

$$L2=Q_L\cdot R/2\eta f$$

$$R=((V_{CC}-V_o)^2/P)\cdot 0.576801\cdot(1.0000086-0.414395/Q_L-0.557501/Q_L^2+0.205967/Q_L^3)$$

$$C1=(1/(34.2219\cdot f\cdot R))\cdot(0.99866+0.91424/Q_L-1.03175/Q_L^2)+0.6/(2\eta f)^2\cdot(L1)$$

$$C2=(1/2\eta fR)\cdot(1/Q_L-0.104823)\cdot(1.00121+(1.01468/Q_L-1.7879))-(0.2/((2\eta f)^2\cdot L1))$$

This allows for a rapid heating up of a susceptor having an ohmic resistance of R=0.6Ω to deliver approximately 7 W of power in 5-6 seconds assuming that a current of approximately 3.4 A is available using a DC power source having a maximum output voltage of 2.8 V and a maximum output current of 3.4 A, a frequency of f=5 MHz (duty ratio=50%), an inductivity of inductor L2 of approximately 500 nH and an ohmic resistance of the inductor L2 of $R_{Coil}$=0.1Ω, an inductivity L1 of about 1 μH, and capacitances of 7 nF for capacitor C1 and of 2.2 nF for capacitor C2. The effective resistance of $R_{Coil}$ and $R_{Load}$ is approximately 0.6Ω. An efficiency (Power dissipated in the susceptor 21/maximum power of DC power source 11) of about 83.5% may be obtained which is very effective.

As has been mentioned already, the susceptor 21 can be made of a material or of a combination of materials having a Curie temperature which is close to the desired temperature to which the susceptor 21 should be heated. Once the temperature of the susceptor 21 exceeds this Curie temperature, the material changes its ferromagnetic properties to paramagnetic properties. Accordingly, the energy dissipation in the susceptor 21 is significantly reduced since the hysteresis losses of the material having paramagnetic properties are much lower than those of the material having the ferromagnetic properties. This reduced power dissipation in the susceptor 21 can be detected and, for example, the generation of AC power by the DC/AC inverter may then be interrupted until the susceptor 21 has cooled down below the Curie temperature again and has regained its ferromagnetic properties. Generation of AC power by the DC/AC inverter may then be resumed again.

For operation, the smoking article 2 is inserted into the cavity 14 (see FIG. 2) of the inductive heating device 1 such that the aerosol-forming substrate 20 comprising the susceptor 21 is inductively coupled to inductor 2 (e.g. the helically wound cylindrical coil). Susceptor 21 is then heated for a few seconds as described above, and then the consumer may begin drawing the aerosol through the filter 22 (of course, the smoking article does not necessarily have to comprise a filter 22).

The inductive heating device and the smoking articles can generally be distributed separately or as a kit of parts. For example, it is possible to distribute a so-called "starter kit" comprising the inductive heating device as well as a plurality of smoking articles. Once the consumer has purchased such starter kit, in the future the consumer may only purchase smoking articles that can be used with this inductive heating device of the starter kit. The inductive heating device is easy to clean and in case of rechargeable batteries as the DC power source, these rechargeable batteries are easy to be recharged using a suitable charging device that is to be connected to the docking port 12 comprising pin 120 (or the inductive heating device is to be docked to a corresponding docking station of a charging device).

Having described embodiments of the invention with the aid of the drawings, it is clear that many changes and modifications are conceivable without departing from the general teaching underlying the instant invention. Therefore, the scope of protection is not intended to be limited to the specific embodiments, but rather is defined by the appended claims.

The invention claimed is:

1. An inductive heating device for heating an aerosol-forming substrate, the inductive heating device comprising:
a device housing
a DC power source having a DC supply voltage,
a power supply electronics configured to operate at a frequency in a range of 1 MHz to 30 MHz, the power supply electronics comprising a DC/AC inverter connected to the DC power source, the DC/AC inverter including a Class-E power amplifier including a transistor switch, a transistor switch driver circuit, and an LC load network configured to operate at an ohmic load smaller than 2 Ohms, wherein the LC load network comprises a shunt capacitor and a series connection of a capacitor and an inductor having an ohmic resistance, and
a cavity arranged in the device housing, the cavity having an internal surface shaped to accommodate at least a portion of the aerosol-forming substrate wherein, when the portion of the aerosol-forming substrate is accommodated in the cavity, the inductor of the LC load network is configured to inductively couple to a susceptor positioned within the aerosol-forming substrate to heat the aerosol-forming substrate during operation,
wherein the device is configured for heating a tobacco-laden solid aerosol-forming substrate,
wherein the inductor is embedded in a radially outermost wall of the device housing at the proximal end of the device housing to surround the cavity which is also arranged at the proximal end of the device housing.

2. The inductive heating device according to claim 1, wherein the DC supply voltage of the DC power source is in the range of 2.5 Volts to 4.5 Volts, and wherein the DC supply amperage of the DC power source is in the range of 2.5 Amperes to 5 Amperes.

3. The inductive heating device according to claim 1, wherein the total volume of the power supply electronics is equal to or smaller than 2 cm$^3$.

4. The inductive heating device according to claim 1, wherein the inductor of the LC load network comprises a helically wound cylindrical inductor coil having an oblong shape and defining an inner volume in the range of 0.15 cm$^3$ to 1.10 cm$^3$, and wherein the helically wound cylindrical inductor coil is positioned on or adjacent the internal surface of the cavity.

5. The inductive heating device according to claim 1, wherein the device housing has a substantially cylindrical shape with the cavity being arranged at the proximal end of the device housing and with the DC power source being arranged at the distal end of the device housing, and wherein the power supply electronics is arranged between the DC power source and the cavity.

6. The inductive heating device according to claim 1, wherein the DC power source comprises a rechargeable DC battery.

7. The inductive heating device according to claim 1, wherein the power supply electronics further comprises a microcontroller which is programmed to interrupt generation of AC power by the DC/AC inverter as the temperature of the susceptor positioned within the aerosol-forming substrate has exceeded a Curie temperature of the susceptor during operation, and which is programmed to resume generation of AC power as the temperature of the susceptor has cooled down below this Curie temperature again.

8. The inductive heating device according to claim 1, wherein the class E power amplifier has an output impedance and wherein the power supply electronics further comprises a matching network for matching the output impedance of the class E power amplifier to the ohmic load.

9. The inductive heating device according to claim 1, wherein the aerosol-forming substrate comprises the susceptor, and wherein the inductor of the LC load network is configured to inductively couple to the susceptor of the aerosol-forming substrate during operation.

10. The inductive heating device according to claim 1, wherein the power supply electronics are configured such that a rise of a transistor voltage of the transistor switch is delayed until after a current through the transistor switch is reduced to zero, the transistor voltage of the transistor switch is returned to zero before the current through the transistor switch begins to rise, the transistor voltage at a turn-on time is set such that turning on the transistor switch does not discharge the shunt capacitor, and a slope of the transistor voltage of the transistor switch is zero at the turn-on time.

11. An inductive heating system comprising:
an inductive heating device according to claim 1 and a smoking article including an aerosol-forming substrate and a filter immediately adjacent to the aerosol-forming substrate, at least a portion of the aerosol-forming substrate being accommodated in the cavity of the inductive heating device with a susceptor positioned within the aerosol-forming substrate, such that the inductor of the LC load network of the DC/AC inverter of the inductive heating device is inductively coupled to the susceptor positioned within the aerosol-forming substrate to heat the aerosol-forming substrate during operation, wherein the aerosol-forming substrate of the smoking article is a tobacco-laden solid aerosol-forming substrate, wherein the filter of the aerosol-forming substrate extends out of the cavity and past the proximal end of the device housing.

12. The inductive heating system according to claim 11, wherein the smoking article is a cylindrical shape with a constant diameter.

13. A method of operating an inductive heating system, the method comprising the steps of:
providing a DC power source having a DC supply voltage,
providing a power supply electronics configured to operate at a frequency in a range of 1 MHz to 30 MHz, the power supply electronics comprising a DC/AC inverter connected to the DC power source, the DC/AC inverter including a Class-E power amplifier including a transistor switch, a transistor switch driver circuit, and an LC load network configured to operate at an ohmic load smaller than 2 MHz, wherein the LC load network comprises a shunt capacitor and a series connection of a capacitor and an inductor having an ohmic resistance,
providing a cavity in a device housing capable of accommodating at least a portion of an aerosol-forming substrate, the cavity being arranged such that upon accommodation of the portion of the aerosol-forming substrate in the cavity the inductor of the LC load network is inductively coupled to a susceptor positioned within the aerosol-forming substrate, and
providing an aerosol-forming substrate and inserting at least a portion of the aerosol-forming substrate into the cavity such that the inductor of the LC load network is inductively coupled to the susceptor positioned within the aerosol-forming substrate,
wherein the aerosol-forming substrate is a tobacco-laden solid aerosol-forming substrate of a smoking article, and
wherein the inductor is embedded in a radially outermost wall of the device housing at the proximal end of the device housing to surround the cavity which is also arranged at the proximal end of the device housing.

14. The method according to claim 13, wherein the DC power source is a rechargeable battery, and wherein the method further comprises the step of charging the rechargeable battery prior to inserting the portion of the aerosol-forming substrate into the cavity.

15. The method according to claim 13, wherein the aerosol-forming substrate comprises the susceptor, and wherein the inductor of the LC load network is configured to inductively couple to the susceptor of the aerosol-forming substrate during operation.

16. The method according to claim 13, further comprising controlling the power supply electronics such that a rise of a transistor voltage of the transistor switch is delayed until after a current through the transistor switch is reduced to zero, the transistor voltage of the transistor switch is returned to zero before the current through the transistor switch begins to rise, the transistor voltage at a turn-on time is set such that turning on the transistor switch does not discharge the shunt capacitor, and a slope of the transistor voltage of the transistor switch is zero at the turn-on time.

17. The method according to claim 13, wherein the smoking article includes a filter immediately adjacent to the aerosol-forming substrate, and the filter extends out of the cavity and past the proximal end of the device housing.

18. The method according to claim 17, wherein the smoking article has a cylindrical shape with a constant diameter.

19. A kit comprising an inductive heating device according to claim 1 and an aerosol-forming substrate, the inductive heating device and the aerosol-forming substrate being configured such that in operation at least a portion of the aerosol-forming substrate is accommodated in the cavity of the inductive heating device with a susceptor positioned within the aerosol-forming substrate, such that the inductor of the LC load network of the DC/AC inverter of the inductive heating device is inductively coupled to the susceptor positioned within the aerosol-forming substrate,
wherein the aerosol-forming substrate is a tobacco-laden solid aerosol-forming substrate of a smoking article.

20. The kit according to claim 19, wherein the smoking article includes a filter immediately adjacent to the aerosol-forming substrate, and the filter extends out of the cavity and past the proximal end of the device housing.

21. The kit according to claim 20, wherein the smoking article has a cylindrical shape with a constant diameter.

* * * * *